(12) United States Patent
Choi et al.

(10) Patent No.: US 7,674,685 B2
(45) Date of Patent: Mar. 9, 2010

(54) SEMICONDUCTOR DEVICE ISOLATION STRUCTURES AND METHODS OF FABRICATING SUCH STRUCTURES

(75) Inventors: Jong-Wan Choi, Suwon-si (KR);
Ju-Seon Goo, Suwon-si (KR);
Hong-Gun Kim, Suwon-si (KR);
Yong-Soon Choi, Yongin-si (KR);
Sung-Tae Kim, Seoul (KR);
Eun-Kyung Baek, Suwon-si (KR)

(73) Assignee: Samsung Electronics Co, Ltd., Gyeonggi-do (KR)

( * ) Notice: Subject to any disclaimer, the term of this patent is extended or adjusted under 35 U.S.C. 154(b) by 627 days.

(21) Appl. No.: 11/654,588

(22) Filed: Jan. 18, 2007

(65) Prior Publication Data
US 2008/0014711 A1    Jan. 17, 2008

(30) Foreign Application Priority Data
Jul. 12, 2006    (KR) .................... 10-2006-0065531

(51) Int. Cl.
*H01L 21/76* (2006.01)
(52) U.S. Cl. ................ 438/427; 438/435; 257/E21.548
(58) Field of Classification Search ................ 438/427, 438/435; 257/E21.548
See application file for complete search history.

(56) References Cited

U.S. PATENT DOCUMENTS 6,683,354 B2    1/2004    Heo et al.
6,693,008 B1*   2/2004    Sato et al. .................... 438/256
6,756,654 B2*   6/2004    Heo et al. .................... 257/510
2005/0258463 A1  11/2005   Yaegashi et al.

FOREIGN PATENT DOCUMENTS

| JP | 2000-183150 | 6/2000 |
|---|---|---|
| JP | 2005-332885 | 2/2005 |
| KR | 1020030050781 A | 6/2003 |
| KR | 10-2004-0049739 | 6/2004 |
| KR | 1020050063266 A | 6/2005 |
| KR | 10-2006-0076517 | 7/2006 |

* cited by examiner

*Primary Examiner*—Chandra Chaudhari
(74) *Attorney, Agent, or Firm*—Harness, Dickey & Pierce, P.L.C.

(57) ABSTRACT

Disclosed are methods for fabricating semiconductor devices incorporating a composite trench isolation structure comprising a first oxide pattern, a SOG pattern and a second oxide pattern wherein the oxide patterns enclose the SOG pattern. The methods include the deposition of a first oxide layer and a SOG layer to fill recessed trench regions formed in the substrate. The first oxide layer and the SOG layer are then subjected to a planarization sequence including a CMP process followed by an etchback process to form a composite structure having a substantially flat upper surface that exposes both the oxide and the SOG material. The second oxide layer is then applied and subjected to a similar CMP/etchback sequence to obtain a composite structure having an upper surface that is recessed relative to a plane defined by the surfaces of adjacent active regions.

32 Claims, 17 Drawing Sheets

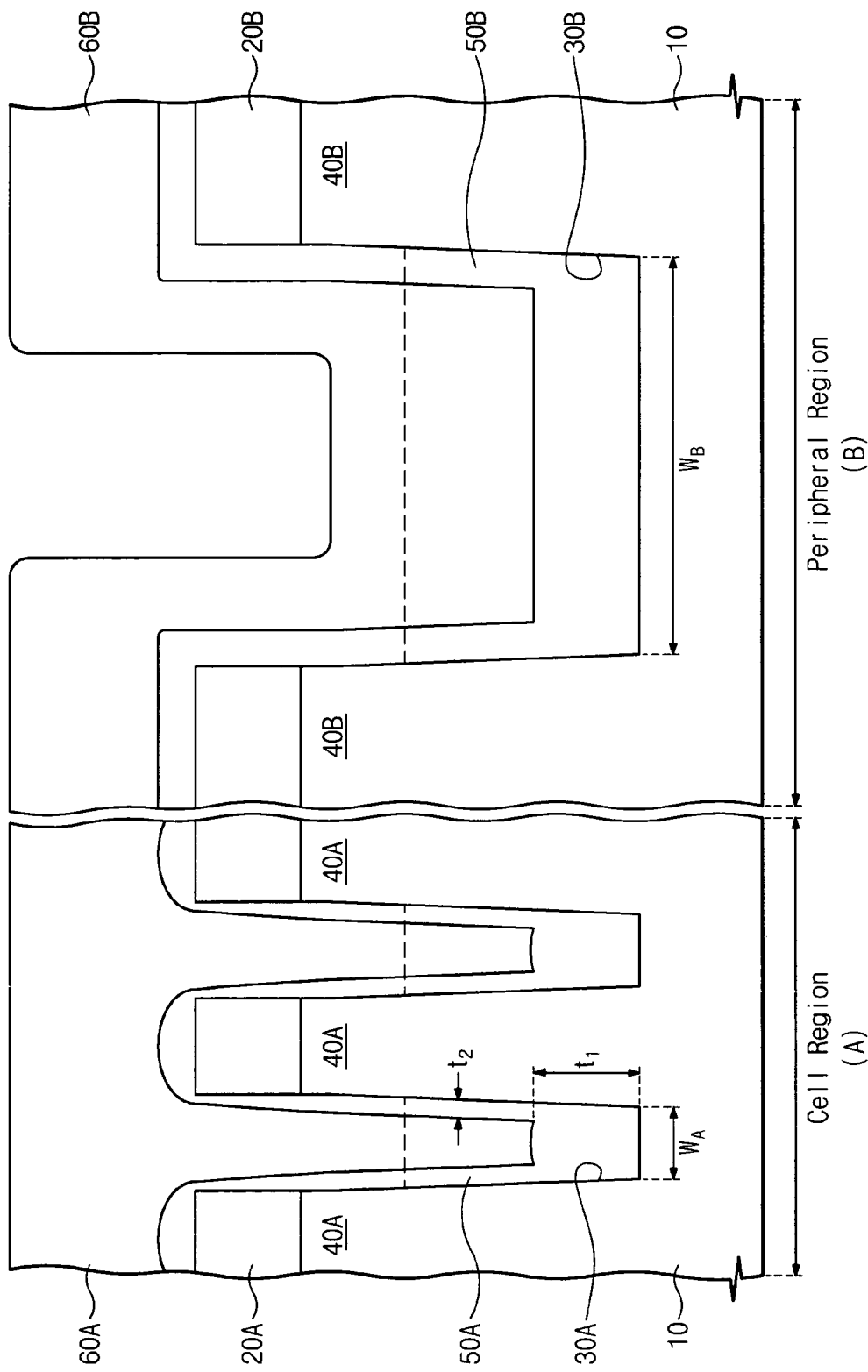

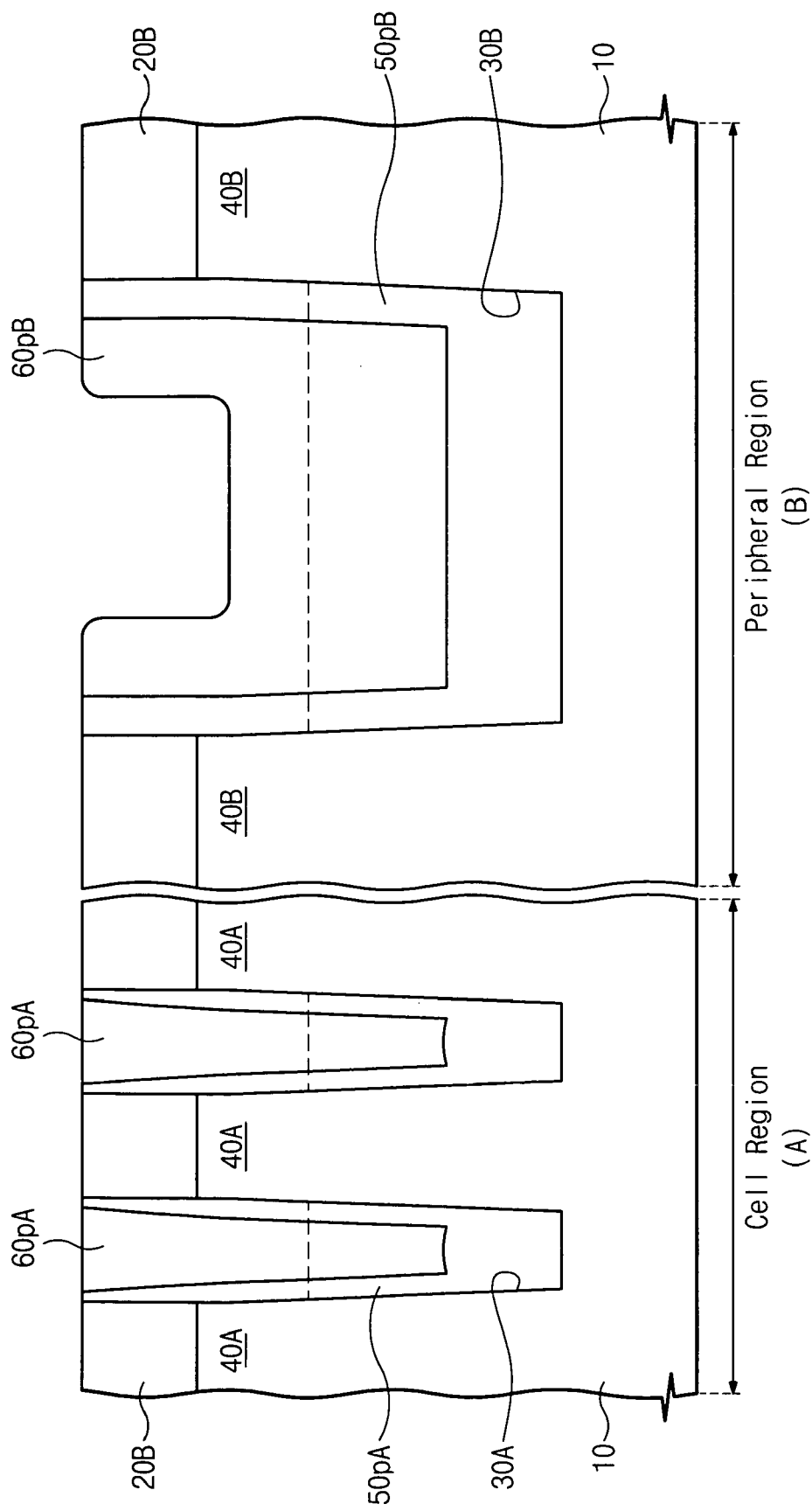

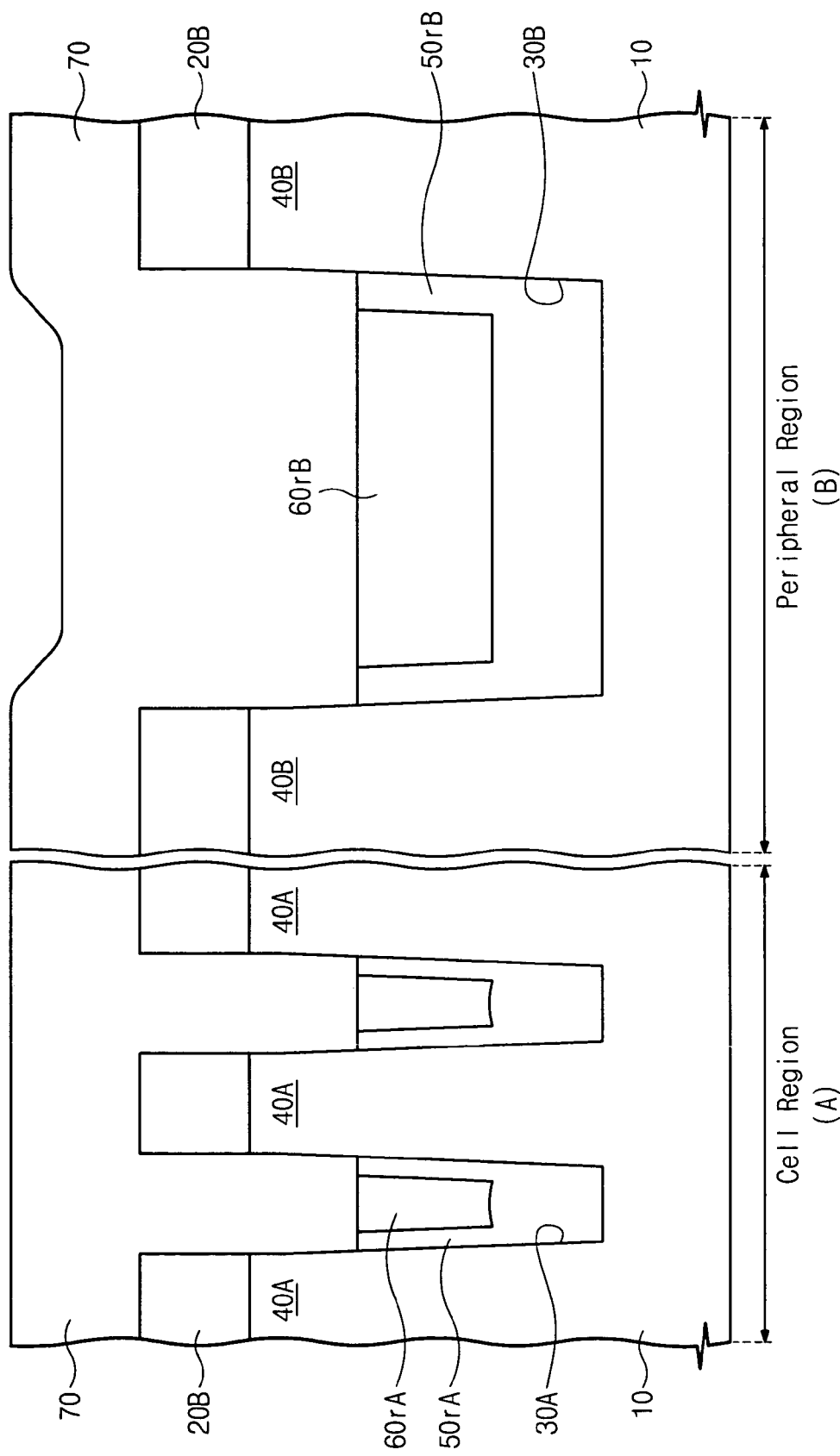

SEMICONDUCTOR DEVICE ISOLATION STRUCTURES AND METHODS OF FABRICATING SUCH STRUCTURES

PRIORITY STATEMENT

This non-provisional application claims priority under 35 U.S.C. § 119(a) on Korean Patent Application No. 2006-65531, which was filed in the Korean Patent Office on Jul. 12, 2006, the contents of which is herein incorporated, in its entirety, by reference.

BACKGROUND

1. Field of Endeavor

The example embodiments relate to methods of forming isolation structures useful in semiconductor processing, methods of forming semiconductor devices incorporating such isolation structures and semiconductor devices that incorporate one or more such isolation structures. The example embodiments include, for example, methods of forming isolation structures useful in non-volatile semiconductor memory devices, methods of manufacturing non-volatile memory devices incorporating such structures and non-volatile memory devices incorporating such structures.

2. Description of the Related Art

Efforts to increase levels of integration in electronic devices including, for example, integrated circuits and display devices incorporating such integrated circuits, and reduce the overall size of the electronic devices have resulted in design rules that reflect gradually decreasing critical dimensions including, for example, the spacing of adjacent active regions within the devices and/or variations in conductor width and spacing of electrode patterns formed during fabrication of such devices. The design rules also tend to produce openings or recesses having increasing aspect ratios, the result of the recess depth divided by the recess width. Recessed regions having an aspect ratio greater than about nine may be considered to have a relatively high aspect ratio.

A variety of insulating materials have been used in the formation of conventional shallow trench isolation ("STI") structures including, for example, high density plasma ("HDP") oxide, undoped silicate glass ("USG"), tetraethyl orthosilicate ("TEOS") and other materials and combinations thereof well known to those skilled in the art. As is also well known to those skilled in the art, using these conventional materials to fill high aspect ratio recesses presents certain processing and/or potential yield and/or reliability concerns.

In particular, the use of conventional insulating materials to fill the recessed trench regions tends to result in greater deposition rates at or near the surface in which the recess is formed. This increased deposition near the surface opening of the trench regions tends to close the recess prematurely, thereby tending to leave one or more central voids in the material filling the trench. One means for reducing the formation of voids in the isolation structures involves the application of a spin-on-glass ("SOG") composition that does not exhibit the enhanced deposition rate near the opening of the recess, thereby tending to improve the uniformity of the fill material (s) within the recess.

SOG materials, however, may be contaminated with carbon and/or other conductive materials that have been associated with increased leakage currents, for example, leakage at the interface between active regions and the trench sidewall, that may compromise the performance of the resulting devices. One solution that has been proposed includes the use of both an HDP oxide deposition that partially fills the trench and an upper SOG layer that fills the remainder of the trench, thereby reducing the contact between the SOG and the active regions and reducing the likelihood of void formation within the fill material. Another proposed solution involves the use of a composite oxide-nitride-oxide ("ONO") insulating layer formed over the SOG. Unfortunately, it has proven difficult to achieve acceptable uniformity in the ONO layer when formed on the SOG layer which may result from variations in the underlying SOG layer, for example, variations in the carbon/organic content of the SOG layer and/or variations in the porosity of the SOG layer, both wafer-to-wafer and/or across a single wafer. Another proposal utilizes a second layer of HDP oxide on the SOG layer rather than an ONO composite layer in order to improve the layer uniformity.

As will be appreciated by one skilled in the art, in the course of depositing and/or forming the various layers of insulating material used to fill the trench isolation opening, similar layers of material are being deposited on the surface of the adjacent active regions. In order to expose the surface of the active regions for subsequent processing, these insulating layers must be removed. Conventional methods of removing this insulating material typically utilize an etch-back ("E/B") process (sometimes referred to as a blanket etch) and/or a chemical-mechanical polishing ("CMP") process. The relatively smaller widths of the trench openings found in the cell region or core region when compared with the widths of the corresponding trench openings found in the peripheral region, however, tend to result in excess material being removed from the peripheral region in order to ensure that the removal is substantially complete in the cell regions.

The structures produced by several such conventional methods are illustrated in FIGS. 1-3. As shown in FIG. 1, the first conventional structure includes a lower HDP oxide 31 and an upper SOG material 32 in which an ONO layer is formed in direct contact with the SOG oxide. As noted above, this structure is associated with certain characteristic deficiencies, particularly with regard to reduced uniformity of the ONO layer associated with variations in the properties and/or characteristics of the underlying SOG material. It is also noted that, as illustrated in FIG. 1, the lower HDP oxide 31 forms a trough or bowl-shaped structure in which the SOG material 32 is contained so that the periphery of the lower HDP oxide extends above the surface of the SOG material and, indeed, above a plane defined by the surfaces of the adjacent active regions.

As illustrated in FIG. 2, a second conventional structure includes both a lower HDP oxide 61a that defines a trough or channel-shaped structure in which a SOG material 63a is deposited, with the SOG material being capped with a second HDP oxide 65a. The HDP oxides 61a, 65a may be formed, for example, using a hydrogen injected HDP CVD method. Again, as illustrated in FIG. 2, the lower HDP oxide structure 61a includes peripheral regions that extend above the upper surface of the SOG material 63a, but, unlike the structure illustrated in FIG. 1, includes an upper HDP oxide 65a to cap the SOG material and prevent subsequent layers from being formed on the SOG material surface. The upper HDP oxide 65a also extends above a plane defined by the surfaces of the adjacent active regions, resulting in a surface that is non-planar.

As illustrated in FIG. 3, a third conventional structure includes a lower HDP oxide 12a that defines a trough or channel-shaped structure in which a SOG material 13 is deposited and an upper HDP oxide 12b that caps the SOG material. In this conventional structure, the SOG material typically comprises a hydrogen silsesquioxane ("HSQ") or a polysiloxane. Again, as in FIGS. 1 and 2, the lower HDP oxide structure 12a illustrated in FIG. 3 includes peripheral regions that extend above the upper surface of the SOG material 13, but, unlike the structure illustrated in FIG. 1, includes an upper HDP oxide 12b to cap the SOG material and prevent subsequent layers from being formed on the SOG material surface and, unlike the structure illustrated in FIG. 2, the surface of the upper HDP oxide is generally co-planar with the surfaces of the adjacent active regions, thereby providing a substantially planar surface for subsequent processing.

SUMMARY OF EXAMPLE EMBODIMENTS

Example embodiments include methods of fabricating semiconductor devices comprising, forming a hard mask pattern exposing a cell region portion and a peripheral region portion of a semiconductor substrate; removing the exposed portions of the semiconductor substrate to form a cell region trench structure and a peripheral region trench structure; depositing a first insulating layer to a thickness $T_{I1}$ whereby the trench structures are only partially filled; depositing a spin-on-glass (SOG) layer to a thickness $T_S$ sufficient to fill the cell region trench structure; treating the SOG layer to form a silicon oxide layer; removing upper portions of the silicon oxide layer and the first insulating layer to form a planarized surface having exposed surfaces of a silicon oxide layer pattern, a first insulating layer pattern and the hard mask pattern; removing a thickness $T_r$ of material from both the cell region trench structure and the peripheral region trench structure to form first recesses that have a bottom surface below a reference plane defined by the primary surface of the semiconductor substrate, wherein the bottom surface includes exposed surfaces of a modified silicon oxide pattern and a modified first insulating layer pattern, depositing a second insulating layer to a depth $T_{I2}$ sufficient to fill the recessed regions; and removing an upper portion of the second insulating layer to form a planarized surface including a second insulating layer pattern and the hard mask pattern.

Other example embodiments include additional methods of fabricating semiconductor devices wherein the cell region trench structure has a depth $D_c$ and the peripheral region trench structure has a depth $D_p$, both depths being measured from a primary surface of the semiconductor substrate adjacent the trench structure, and further wherein the expression $D_p \geqq D_c$ is satisfied; wherein the peripheral region trench structure $D_p$ is no more that 250% of the cell region trench structure $D_c$; wherein the thickness $T_s$ of the spin-on-glass (SOG) layer is sufficient to fill the peripheral region trench structure; and wherein the thickness $T_s$ of the spin-on-glass (SOG) layer is not sufficient to fill the peripheral region trench structure.

Other example embodiments include additional methods of fabricating semiconductor devices including other process steps including, for example, depositing a sacrificial insulating layer to a thickness sufficient to fill the peripheral region trench structure; removing upper portions of the sacrificial insulating layer, the silicon oxide layer and the first insulating layer to form a planarized surface having exposed surfaces of a sacrificial insulating layer pattern, a silicon oxide layer pattern, a first insulating layer pattern and the hard mask pattern; removing a thickness $T_r$ of material from both the cell region trench structure and the peripheral region trench structure to form first recesses that have a bottom surface below a reference plane defined by the primary surface of the semiconductor substrate, wherein the bottom surface includes exposed surfaces of a modified silicon oxide pattern and a modified first insulating layer pattern, depositing a second insulating layer to a depth $T_{I2}$ sufficient to fill the recessed regions; and removing an upper portion of the second insulating layer to form a planarized surface including a second insulating layer pattern and the hard mask pattern.

Other example embodiments include additional methods of fabricating wherein the recessed region in the cell region has an aspect ratio $A_c$ and the recessed region in the peripheral region has an aspect ratio $A_p$ that satisfy the expression $A_c \geqq A_p$; the recessed region aspect ratio $A_c$ is no greater than 5; and wherein treating the SOG layer further comprises removing a majority of a solvent from a SOG composition containing a major portion of polysilazane and converting the polysilazane to silicon oxide.

Other example embodiments include additional methods of fabricating semiconductor devices including other process steps including, for example, removing the hard mask pattern to expose active regions on the primary surface of the semiconductor substrate; forming a dielectric pattern on the exposed active regions; forming a semiconductor material pattern on the dielectric pattern; removing an upper portion of the second insulating layer pattern to form openings having a bottom surface below the reference plane; forming a second dielectric material layer on exposed surfaces of the semiconductor material pattern, the dielectric pattern, the semiconductor substrate and the bottom surface of the openings; depositing a conductive material layer on the second dielectric material layer; and forming a conductive material layer pattern having extended regions that extend below a reference plane defined by top surfaces of adjacent portions of the semiconductor material pattern.

Variations of these methods may produce structures in which the extended regions reach a reference plane defined by the primary surface of the semiconductor substrate or extend below a reference plane defined by the primary surface of the semiconductor substrate; wherein the bottom surface of the openings is from 300 to 500 Å below the reference plane; wherein the first insulating layer has a first average thickness $T_{I1a}$ on surfaces parallel to the reference plane and a second average thickness $T_{I1b}$ on sidewalls of the trench structure that satisfy the expression $T_{I1a} > T_{I1b}$.

Other example embodiments include additional methods of fabricating semiconductor devices including other process steps including, for example, forming an etch mask pattern in the peripheral region before removing the upper portion of the second insulating material pattern to protect the second insulating material pattern in the peripheral regions; forming the second dielectric material layer as a composite structure including silicon oxide/silicon nitride/silicon oxide (ONO); forming the conductive material layer from a conductor selected from a group consisting of polysilicon, metals, metal nitrides, metal silicides and combinations thereof; forming the first insulating layer from a group consisting of HDP oxide, TEOS, USG and combinations thereof; wherein the second insulating layer is selected from a group consisting of HDP, TEOS, USG and combinations thereof; removing an upper portion of the second insulating layer pattern to form openings in the cell region trench structure having a bottom surface; forming a dielectric material layer on exposed surfaces of the hard mask pattern, the semiconductor substrate and the bottom surface of the openings; depositing a conductive material layer on the dielectric material layer; and forming a conductive material layer pattern having extended regions that extend between adjacent portions of the semiconductor material pattern; treating surfaces of the semiconductor substrate exposed within the trench structure to reduce etch damage by, for example, forming a thermal oxide on the surfaces to a thickness sufficient to consume a damaged surface portion of the semiconductor substrate.

Other example embodiments include additional methods of fabricating semiconductor devices wherein the hard mask pattern further comprises a pad layer formed directly on a primary surface of the semiconductor substrate and a primary mask layer formed directly on a surface of the pad layer; wherein the pad layer is, for example, a silicon oxide layer having a thickness $T_p$ and the primary mask layer is a silicon nitride layer having a thickness $T_m$ that may, in some instances, satisfy the expression $T_m > T_p$ is satisfied. In other example embodiments of the methods the hard mask pattern may be formed by depositing a dielectric layer on a primary surface of the semiconductor substrate; forming semiconductor material layer on the dielectric layer; forming a capping layer on the semiconductor material layer; and patterning and etching the capping layer, semiconductor material layer and the dielectric layer.

In other example embodiments of the methods treating the SOG layer may include heating the SOG layer to a first temperature $T_1$ to remove the solvent and thereby form an intermediate polysilazane layer; and heating the polysilazane layer under an oxidizing ambient to a second temperature $T_2$ sufficient to convert the polysilazane layer to the silicon oxide layer, wherein the expression $T_2 > T_1$ is satisfied.

Other example embodiments may include heating the silicon oxide layer to a third temperature $T_3$ sufficient to densify the silicon oxide layer, wherein the expression $T_3 > T_2$ is satisfied, and maintaining the third temperature for a period sufficient to obtain a degree of densification. The degree of densification may be assessed to some degree by comparing the oxide etch rates of the densified silicon oxide layer and the first insulating layer under an identical etch process. The densification under the temperature T3 may be continued until the comparable etch rates differ by no more than 5% to improve the post-etch uniformity of the resulting structures. Other example embodiments of the method may include ensuring that at least 100 Å of the second insulating material pattern remains below the bottom surface of the openings.

BRIEF DESCRIPTION OF PATENT DRAWINGS

Example embodiments described below will be more clearly understood when the detailed description is considered in conjunction with the accompanying drawings, in which:

FIGS. 4A-4F are cross-sectional representations of a first example embodiment of a method for forming isolation structures and the resulting trench isolation structures;

Figure 1:
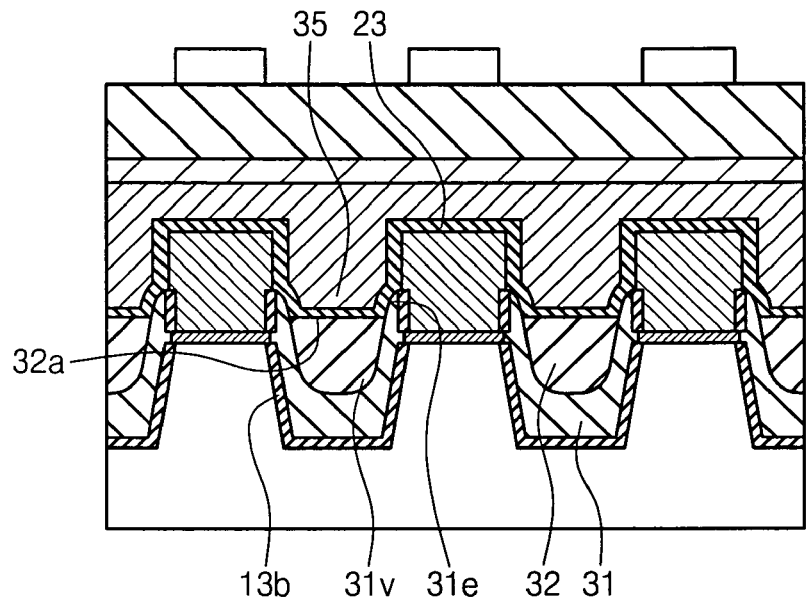
FIGS. 1-3 are cross-sectional representations of conventional isolation structures.
Figure 2:
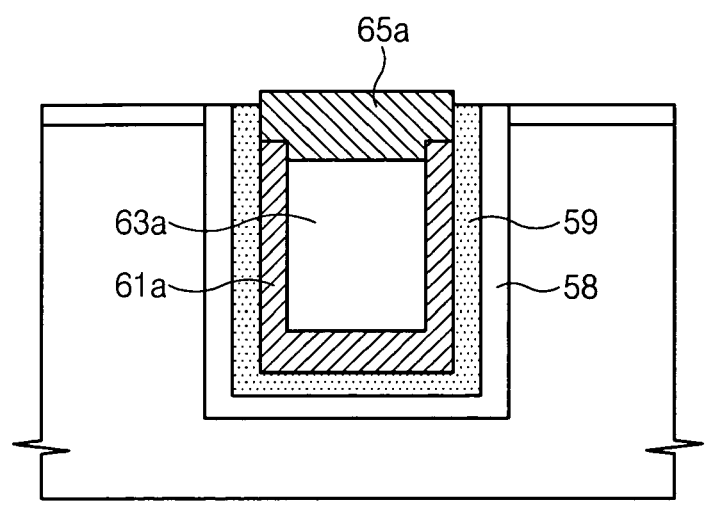
Figure 3:
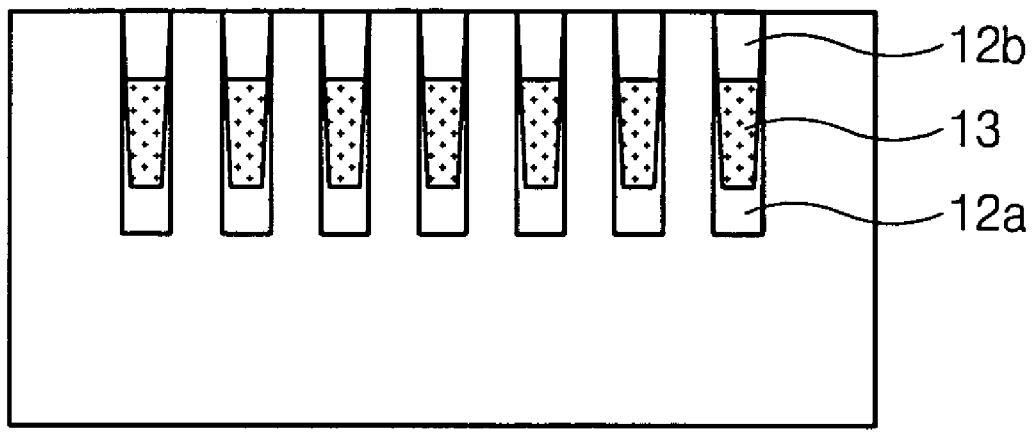

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. In particular, the relative thicknesses and positioning layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described in greater detail with reference to the accompanying drawings.

Example embodiments of methods as disclosed herein may be used in fabricating trench isolation structures for incorporation in, for example, FLASH memory devices. Example embodiments of the resulting trench isolation structures will include a composite structure having lower or first oxide, and intermediate polysilazane SOG material and an upper or second HDP oxide.

Example embodiments for fabricating these structures incorporate process steps whereby an upper portion is removed from both the first oxide and the SOG material to form insulating structures having substantially identical heights relative to a bottom portion and whereby an upper portion of the second HDP oxide is removed to form a substantially planar surface with the adjacent substrate surfaces. Other example embodiments may utilize both a second HDP oxide and an overlying composite ONO insulating structure having a structure that may or may not be recessed relative to the surrounding substrate surfaces.

Example embodiments of the methods for forming the trench isolation structures may include various combinations of planarizing processes including, for example, CMP and E/B processes. These planarizing processes may be utilized in combinations including, for example, CMP-E/B; CMP-E/B-CMP; and CMP-E/B-CMP-E/B, to reduce the differences between the trench isolation structures formed in the cell region(s) and the peripheral region(s) respectively. Similarly, the selection of the insulating materials utilized, the sequence in which they are applied to and removed from the substrate and the processes utilized to apply and to remove the insulating materials may be selected to reduce the differences between the trench isolation structures formed in the cell region(s) and the peripheral region(s) respectively.

Example embodiments of the methods for forming the trench isolation structures may be incorporated in device fabrication processes in which floating gate ("FG") structures are formed including, for example, self-aligned shallow trench isolation processes ("SA-STI") in which floating gate structures are formed before completion of the trench isolation structures. As noted above, example embodiments utilize SOG materials including polysilazane compounds that may be formed and treated under appropriate temperature and atmospheric conditions to obtain insulating materials exhibiting satisfactory performance, for example, an etch rate within about 5% of a thermal oxide.

Figure 4A:
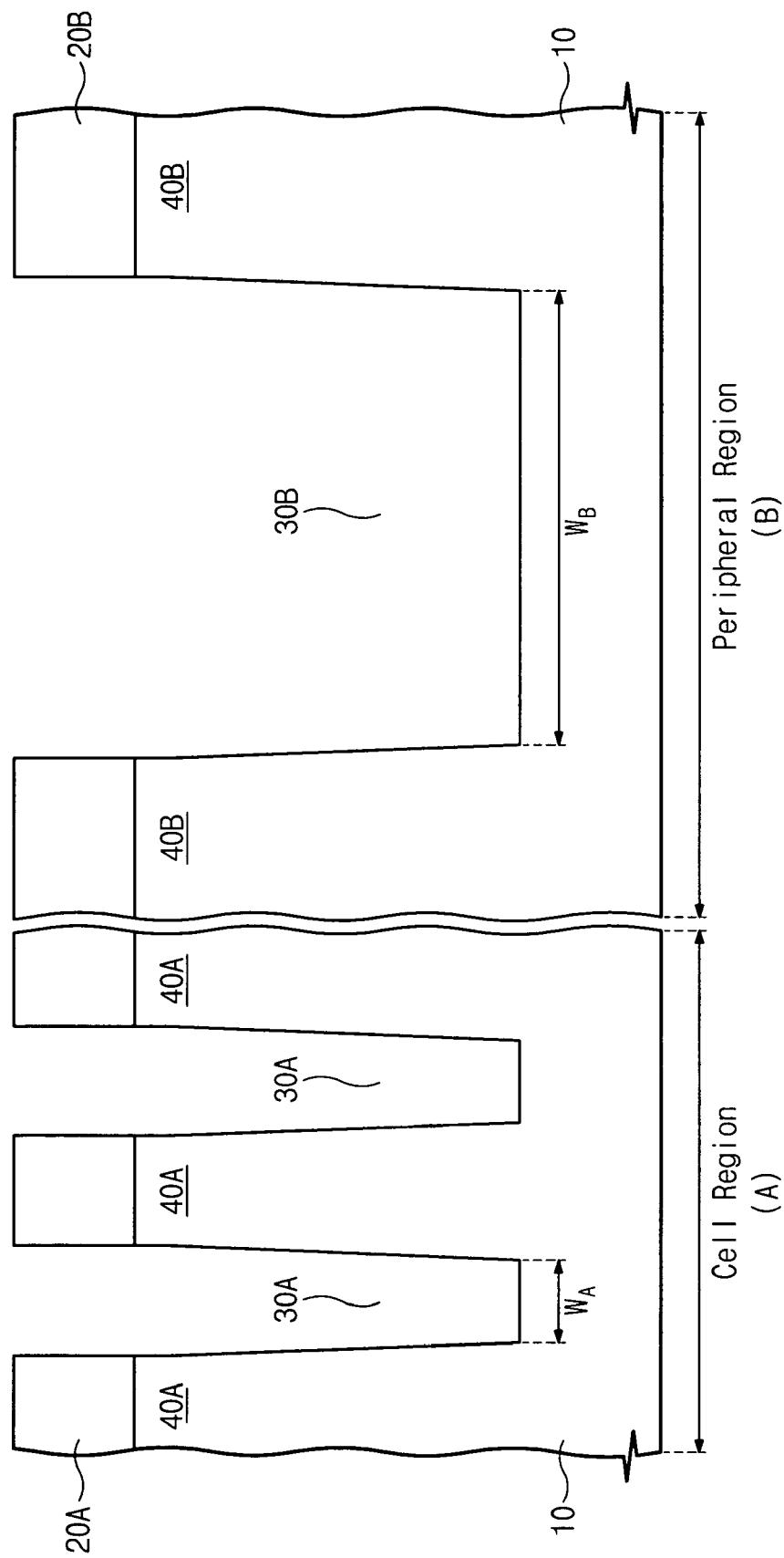

An example embodiment of a method for forming trench isolation structures and the resulting trench isolation structure configuration is illustrated in the cross-sections provided in FIGS. 4A-4F. As illustrated in FIG. 4A, trenches 30A, 30B are formed in the cell region and the peripheral region respectively by etching those portions of substrate 10 exposed by the mask patterns 20A, 20B, thereby defining and separating active regions 40A, 40B. As reflected in FIG. 4A, in many instances the design rules for the trench isolation structures are different in the cell region and the peripheral region with the peripheral region allowing for larger dimensions. As will be appreciated, although the depths of the trenches 30A, 30B will be similar, their respective widths $W_A$ and $W_B$, wherein $W_A<W_B$, will result in trenches exhibiting different aspect ratios, i.e., depth/width.

The mask patterns 20A, 20B may be formed from a combination of silicon oxide, silicon nitride, silicon and photoresist. Depending on the etch chemistry and conditions, the mask patterns may be configured as hard masks, e.g., comprising inorganic materials, or soft masks, e.g., in which one or more organic polymeric patterns remains in place during the etch process. The mask patterns 20A, 20B may also be configured to produce a floating gate structure of, for example, a combination of oxide/silicon or oxide/silicon/nitride layers in which the silicon layer would become the floating gate. Optional processing may be included for forming a thermal oxide layer (not shown) on the silicon surfaces exposed on the sidewall and bottom surfaces of the trench 30 by which damage resulting from the substrate etch process may be reduced or eliminated as the damaged portions of the silicon is consumed in forming the oxide.

As illustrated in FIG. 4B, first oxide layers 50A, 50B may be formed on the exposed surfaces of substrate 10, particularly including the sidewall and bottom surfaces of the trenches 30A, 30B and the exposed surfaces of the mask patterns 20A, 20B using any suitable chemical vapor deposition ("CVD") method. The trenches 30A, 30B are characterized by respective average widths, WA, WB, that satisfy the expression The first oxide layers 50A, 50B may comprise one or more materials selected from HDP oxide, USG and TEOS. In the denser cell region, there may be some variation between the thickness of the first oxide layer 50A formed on the sidewall surfaces of the trench isolation $t_2$ and the thickness of the first oxide layer formed on the bottom surface $t_1$, generally satisfying the expression $t_1>t_2$.

Conversely, due at least in part to the relatively lower aspect ratio exhibited by the trench isolation formed in the peripheral region, the non-uniformity of the first oxide layer 50B may be reduced. When HDP oxide is used in forming the first oxide layer, the oxide layer formed on the trench isolation sidewalls in the cell region may be generally uniform with any thinning being generally confined to those portions of the first oxide layer 50A extending over the mask pattern 20A. Although both USG and TEOS may be used in forming the first oxide layer 50A, those skilled in the art will appreciate that such materials will typically produce a sidewall oxide thickness that is less uniform than that which can be obtained with HDP oxide.

As illustrated in FIG. 4B, a layer of an SOG material 60 may then be formed on the substrate 10 to cover the first oxide layer 50A, 50B and fill an additional portion of the trenches 30A, 30B. As will be appreciated, the SOG material and the application conditions may be selected whereby the trenches in the cell region are filled or substantially filled while the trenches in the peripheral region may still not be completely filled, the situation illustrated in FIG. 4B. Conventional spin-coating methods have been found suitable for forming SOG material layers 60A that are substantially free of voids, particularly in the trenches 30A of the cell region, but those skilled in the art are certainly capable of utilizing other application techniques to obtain satisfactory results.

As noted above, the SOG material in combination with the application method may produce different results in the cell region and the peripheral region. In particular, the reduced width of the trenches 30A in the cell region relative to the width of the trenches 30B in the peripheral region will tend to retard the complete filling of the trenches 30B, thereby producing a relatively thicker first SOG material layer 60A in the cell region. The SOG material layer 60 is formed by applying a polysilazane solution to the surface of the substrate using a conventional process such as spin-coating and then subjecting the layer to a first heat treatment sufficient to reduce the solvent content of the polysilazane solution and provide an initial polysilazane layer and convert the polysilazane to silicon oxide.

The first heat treatment may be conducted at temperature of 100 to 300° C., and may be conducted under an oxidizing atmosphere, e.g., oxygen and/or water vapor, a non-oxidizing atmosphere, e.g., nitrogen, or an inert atmosphere, e.g., argon, maintained at an atmospheric or subatmospheric pressure for a period sufficient to remove the majority of the solvent(s) from the polysilazane solution and form a polysilazane solid. A second heat treatment may then be conducted at a temperature of 300-500° C. under an oxidizing atmosphere of, for example, a mixture of oxygen and water vapor, at a pressure of 10-760 torr for a period sufficient to convert substantially all of the polysilazane to silicon oxide.

An optional third heat treatment may be conducted on the silicon oxide at the temperature of 500-700° C. under an atmosphere of, for example, a mixture of oxygen and water vapor, at a pressure of 10-760 torr to densify the silicon oxide and thereby reduce the etch rate of the material. Those skilled in the art will appreciate that the temperature and the duration of the densification treatment may be adjusted to obtain a desired degree of densification that may, for example, produce an oxide layer having an etch rate approaching that of HDP oxide and/or thermal oxide.

As illustrated in FIG. 4C, upper portions of the SOG layer 60A, 60B and first oxide layer 50A, 50B may be removed to expose upper surfaces of the mask patterns 20A, 20B and form a planarized surface using a conventional CMP process. The remaining portions of the SOG layer 60A, 60B form SOG oxide patterns 60pA, 60pB while the remaining portions of the first oxide layer form first-oxide patterns 50pA, 50pB. Using an appropriate CMP process can reduce the likelihood that excessive amounts of the SOG oxide pattern 60pB and the first oxide pattern 50pB will be removed from the peripheral region during subsequent processing.

Figure 4D:
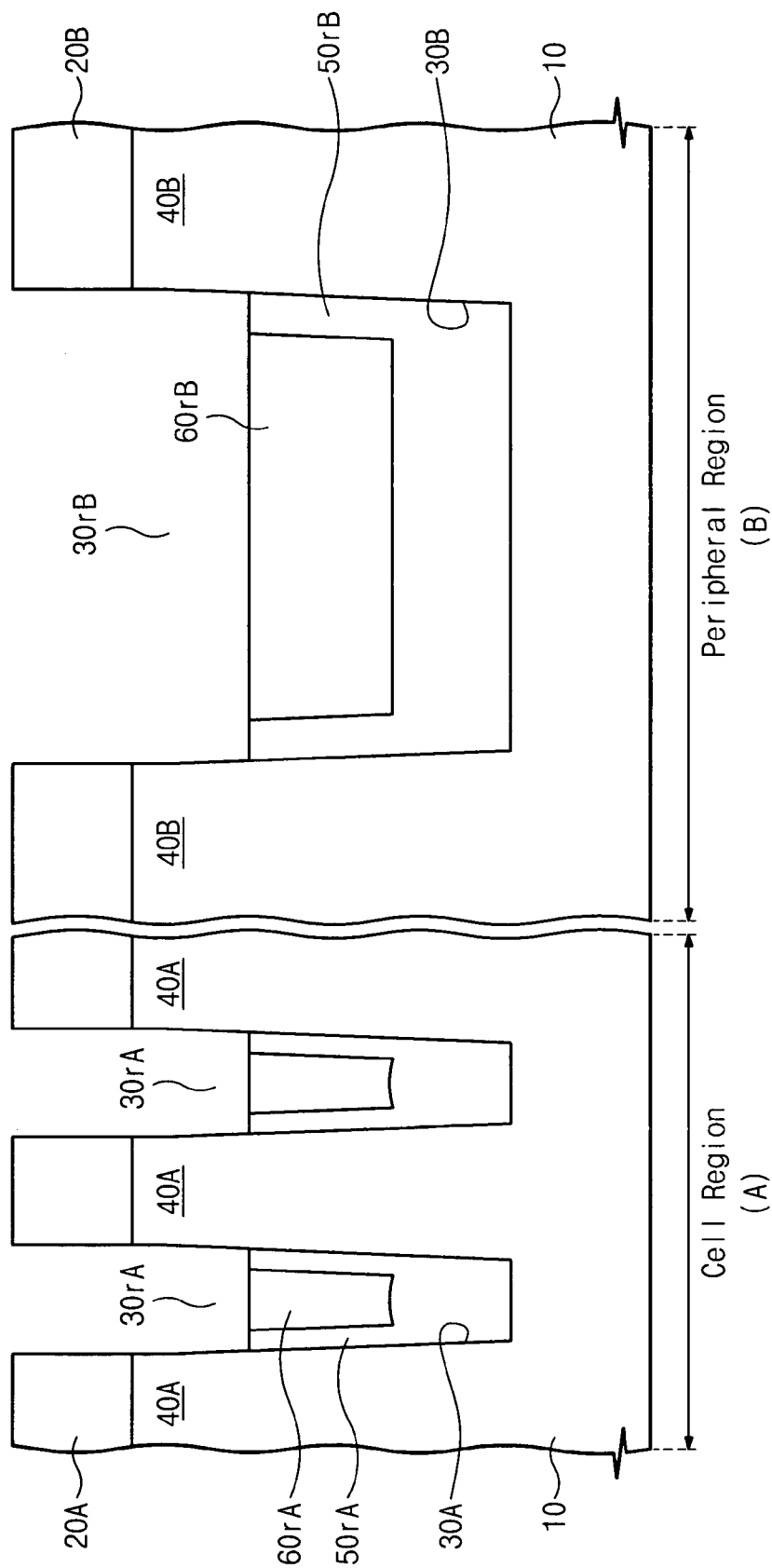

As illustrated in FIG. 4D, additional portions of the SOG oxide patterns 60pA, 60Pb and the first oxide patterns 50pA, 50pB may then be removed using an E/B process to form recessed patterns 30rA, 30rB having a lower surface defined by composite structures including recessed SOG patterns 60rA, 60rB and the recessed first oxide patterns 50rA, 50rB. As illustrated in FIG. 4D, by selecting and/or treating the materials comprising the first oxide and SOG oxide patterns 50pA, 50pB, 60pA, 60pB to provide similar etch rates in the E/B process, the composite structures can be formed with substantially flat upper surfaces, thereby avoiding the trough structure present in the conventional trench isolation structures discussed above. As will be appreciated by those skilled in the art, however, if the respective removal rates for the first oxide pattern and the SOG oxide pattern in the E/B etchant are not substantially similar, the surfaces of the corresponding patterns in the cell region 50pA, 60pA and the peripheral region 50pB, 60pB may not cooperate to produce a substantially flat surface.

As illustrated in FIG. 4D, the recessed patterns 30rA, 30rB have a lower surface that is recessed relative to a plane defined by the top surfaces of the active regions 40A, 40B. In those instances in which the upper surfaces of the recessed SOG oxide patterns 60rA, 60rB are substantially aligned with the upper surfaces of the recessed first oxide patterns 50rA, 50rB, the lower surface of the recessed patterns may be generally planar. Further, the presence of the recessed patterns 50rA, 50rB, 60rA, 60rB filling the lower portion of the original trench isolation openings 30A, 30B to reduces the effective aspect ratios of the trenches in the recessed patterns 30rA, 30rB in the cell region and the peripheral region respectively. The reduced aspect ratios exhibited by recessed patterns. 30rA, 30rB, particularly the recessed pattern found in the cell region 30rA, tend to reduce the likelihood that voids will be formed during subsequent deposition(s) of material for filling the recessed patterns 30rA, 30rB. As noted above, the use of the CMP-E/B planarization process sequence tends to reduce or eliminate the overetching of SOG oxide pattern 60A, 60B and first oxide pattern 50A, 50B, particularly those portions of these patterns found in the peripheral region 50B, 60B.

As illustrated in FIG. 4E, second oxide layer 70 may then be formed on the substrate 10 to fill the recessed patterns 30rA, 30rB and thereby complete the filling of the trenches 30A, 30B. As noted above, the reduced aspect ratio provided by the recessed patterns 30rA, 30rB reduces the likelihood that one or more voids will be formed during the deposition. In addition to HDP oxide, USG and TEOS and combinations thereof may be used in forming the second oxide layer 70.

Figure 4F:
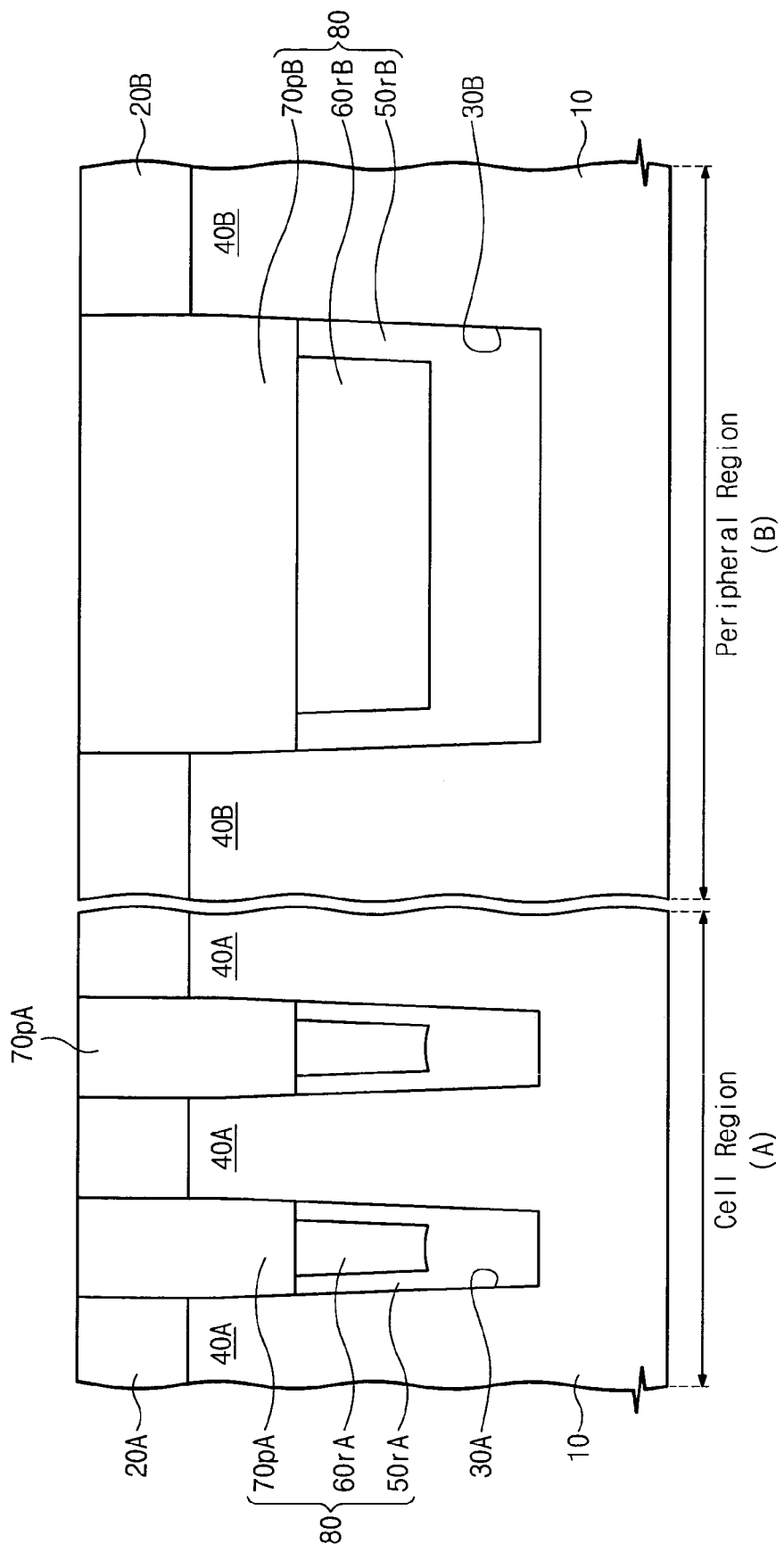

As illustrated in FIG. 4F, an upper portion of the second oxide layer 70 is then be removed using, for example, a second CMP process, to expose an upper surface of the mask pattern 20A, 20B with the residual portions of the second oxide layer comprising second oxide patterns 70pA, 70pB. An additional portion of the second oxide patterns 70pA, 70pB may then be removed (not shown) using an E/B process to recess the top surface of the second oxide patterns 70pA, 70pB relative to a plane defined by the surfaces of the surrounding or bordering active regions.

Figure 5A:
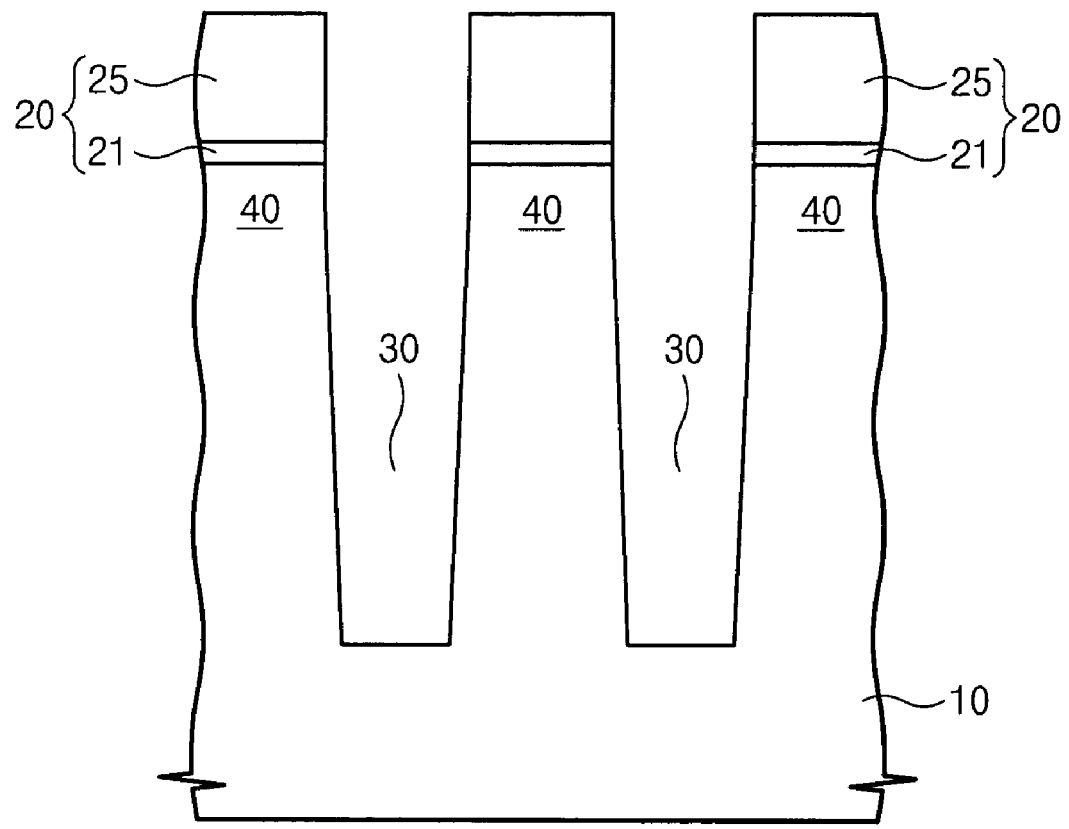
FIGS. 5A-5H are cross-sectional representations of a second example embodiment of a method for forming isolation structures and the resulting trench isolation structures.

Another example embodiment of a method for forming trench isolation structures and the resulting trench isolation structure configuration is illustrated in the cross-sections provided in FIGS. 5A-5H. As illustrated in FIG. 5A, a composite masking layer comprising an intermediate silicon oxide layer (sometimes referred to as a "pad" oxide layer) and an outer silicon nitride layer was formed on substrate 10. A photoresist pattern (not shown) was formed on the composite masking layer and then used as an etch pattern for removing the exposed portions of the nitride and oxide layers to form a mask pattern 20, including both a nitride pattern 25 and an oxide pattern 21, that exposes portions of the substrate surface. The mask pattern 20 was, in turn, used as an etch mask for etching the exposed portions of the substrate 10 to form trenches 30 separating active regions 40. As will be appreciated by those skilled in the art, in addition to serving as an etch mask, the silicon nitride pattern 25 in the mask pattern 20 may be used as a stop layer for subsequent CMP processes.

Figure 5B:
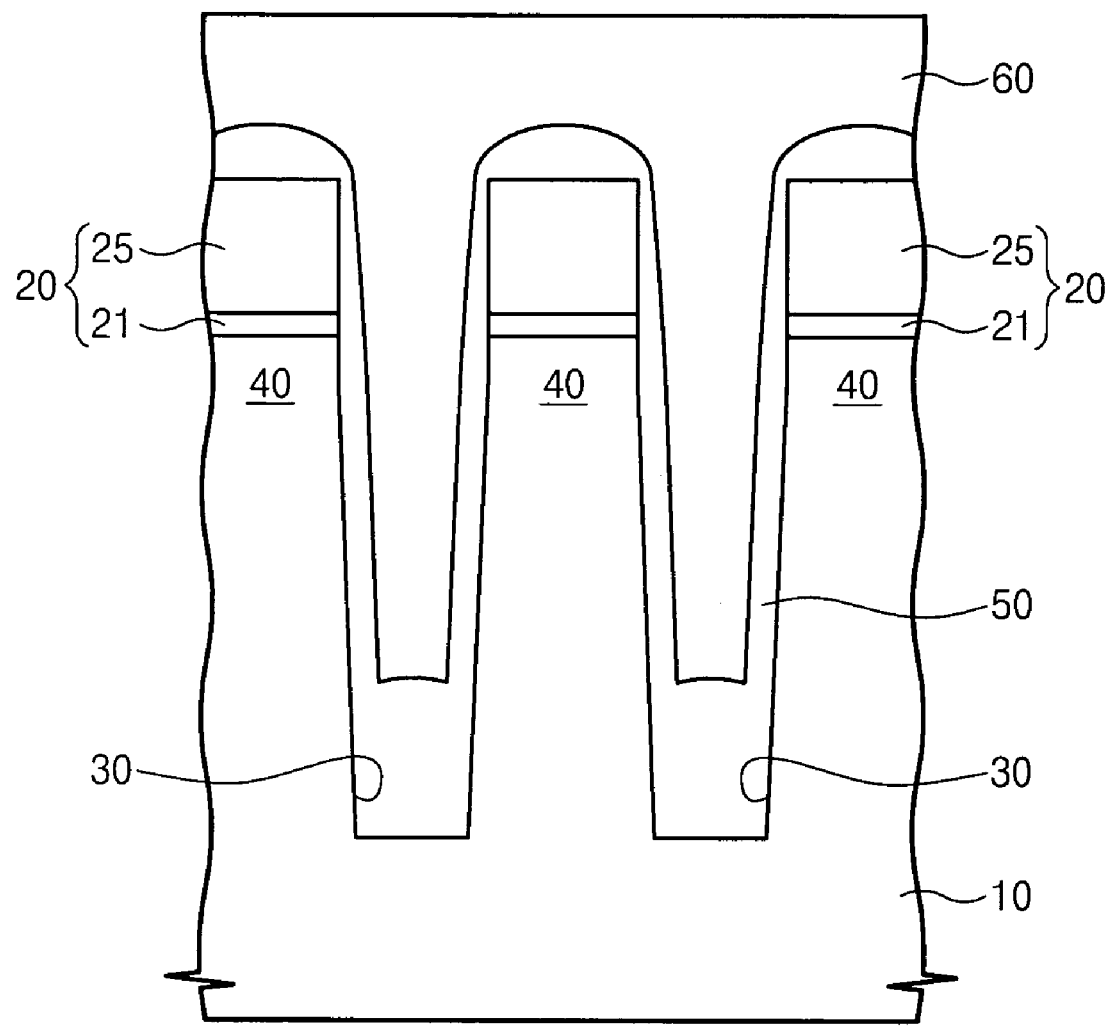

As illustrated in FIG. 5B, a first oxide layer 50, for example, a HDP oxide, is formed on the exposed sidewall and bottom surfaces of the trenches 30 and the sidewall and upper surfaces of the mask pattern 20. As illustrated in FIG. 5B, the first oxide layer 50 may exhibit both thicker and thinner regions with the thicker regions tending to be found on the bottom surface of the trenches 30 and the thinner regions tending to be found on the sidewall surfaces of the trenches. As also illustrated in FIG. 5B, a SOG oxide layer 60 may be formed on the first oxide layer 50 using a conventional process sequence of, for example, spin-coating a SOG composition followed by heat treatment, to fill the remaining portions of the trenches 30.

Figure 5C:
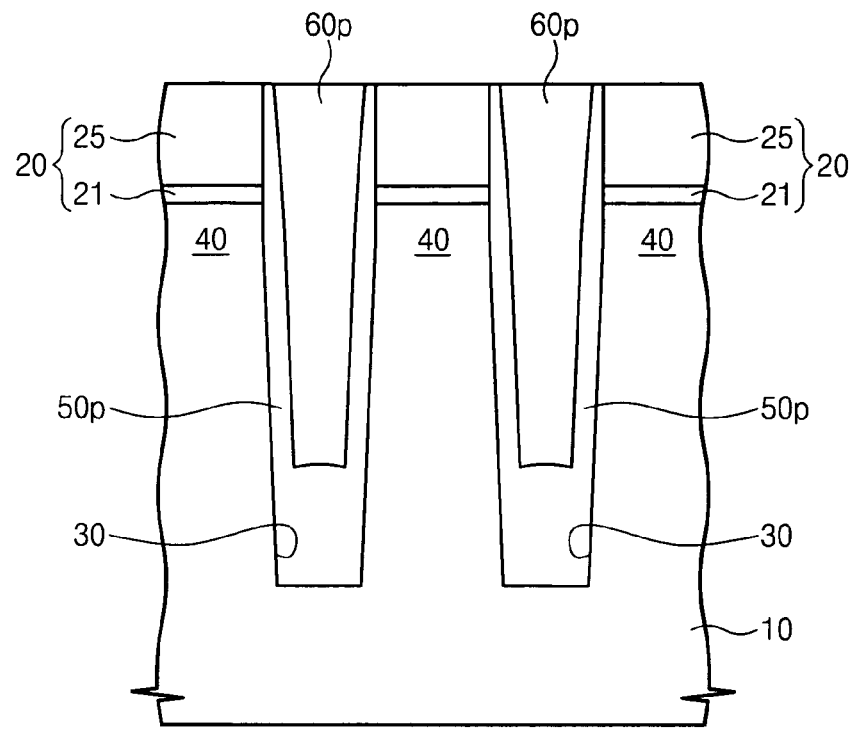

As illustrated in FIG. 5C, an upper portion of the SOG oxide layer 60 and an upper portion of the first oxide layer 50 may be removed by, for example, using a CMP process, to expose upper surfaces of the mask pattern 20. The residual portions of the SOG and first oxide layers comprise a SOG oxide pattern 60p and a first oxide pattern 50p. As noted above, the silicon nitride pattern 25 forming the upper portion of the mask pattern 20 may be utilized as a planarizing stopper layer during the CMP step.

Figure 5D:
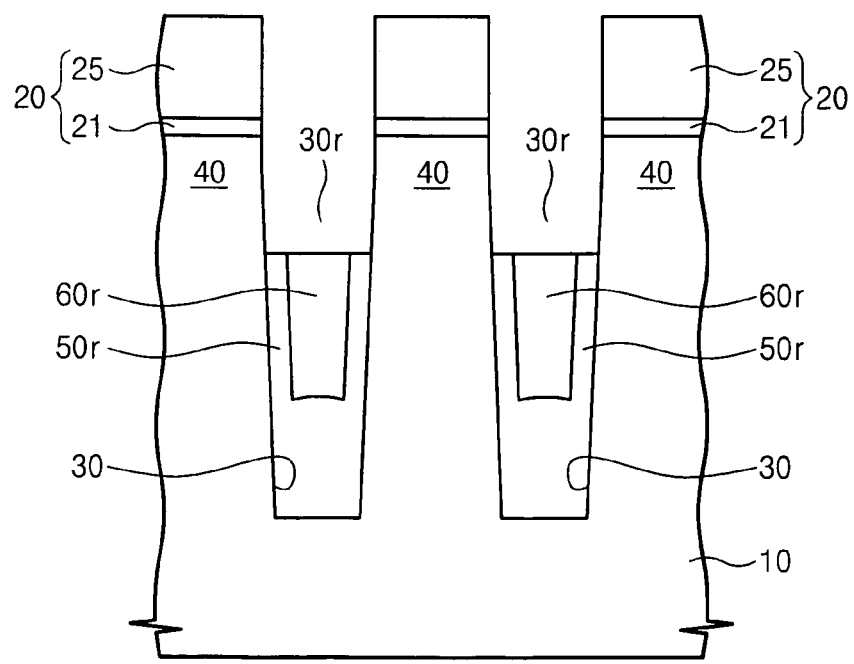

As illustrated in FIG. 5D, upper portions of the SOG oxide pattern 60p and the first oxide pattern 50p may then be removed using an E/B process to form a recessed SOG oxide pattern 60r and a recessed first oxide pattern 50r respectively. As detailed above, by appropriate selection and/or treatment of the insulating materials, the resulting surfaces of the recessed SOG oxide pattern 60r and a recessed first oxide pattern 50r may be substantially coplanar and may be recessed to a depth of about 300-500 Å, typically about 400 Å, relative to a plane defined by the surfaces of the adjacent active regions and thereby forming a recessed pattern 30r.

Figure 5E:
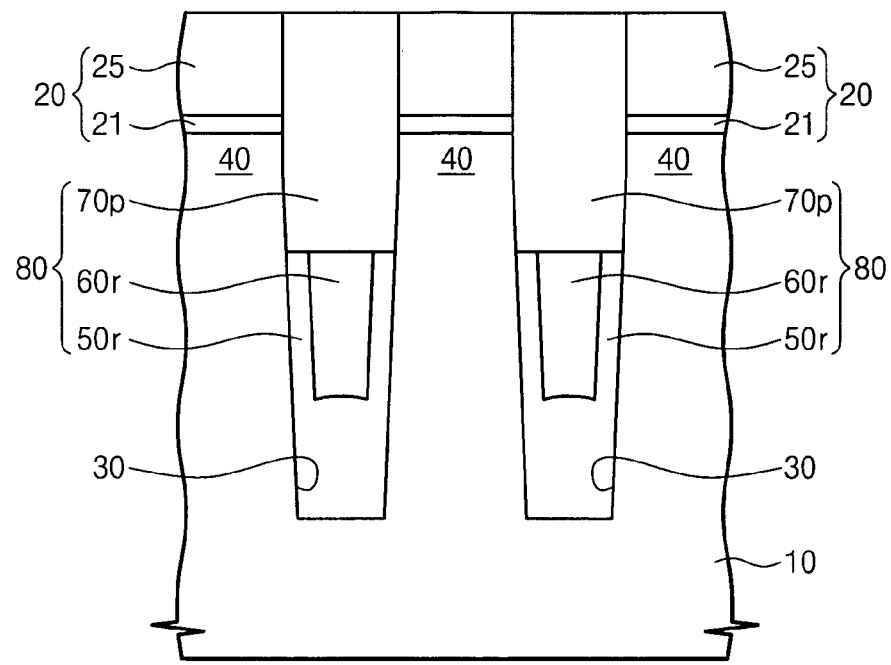

As illustrated in FIG. 5E, a second oxide pattern 70p may be formed by depositing a second oxide layer (not shown) of, for example, HDP oxide, to fill the recessed pattern 30r, and then removing an upper portion of the oxide layer using, for example, a CMP process. As noted above, the second oxide layer is removed until an upper surface of the nitride pattern 25 is exposed, thereby creating a substantially planar surface for subsequent processing.

Figure 5F:
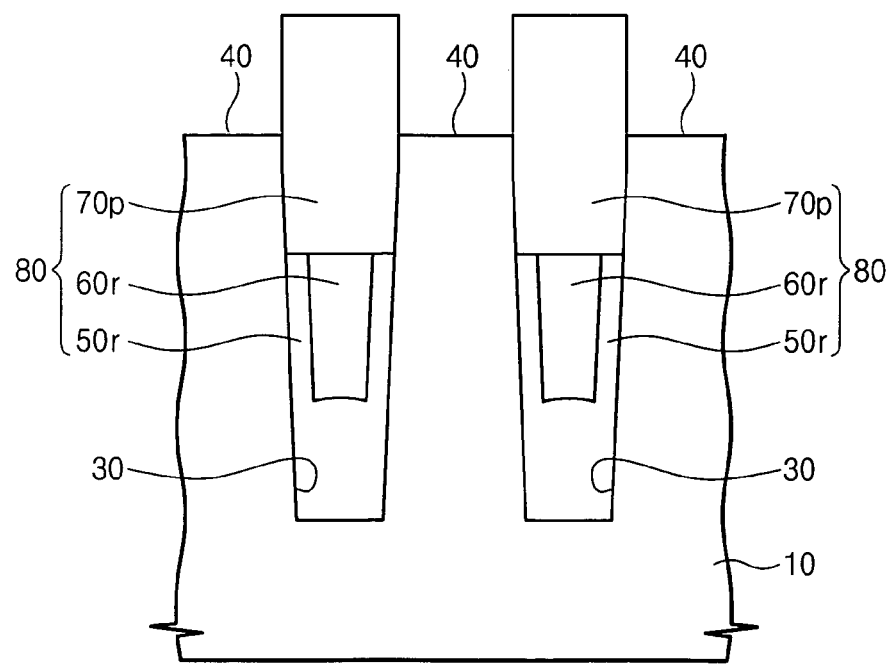

As illustrated in FIG. 5E, the recessed SOG oxide pattern 60r, the recessed first oxide pattern 50r and the second oxide pattern 70p form a composite trench isolation structure 80. As reflected in FIG. 5E, the recessed SOG oxide pattern 60r is encapsulated by the combination of the recessed first oxide pattern 50r and the second oxide pattern 70p. As illustrated in FIG. 5F, the active region 40 may then be exposed by removing the nitride pattern 25 portion of the mask pattern 20. The oxide pattern 21 may be retained for use as a gate dielectric or, more typically, may be removed and replaced with a new thermal oxide or other suitable dielectric layer or combination of layers.

Figure 5G:
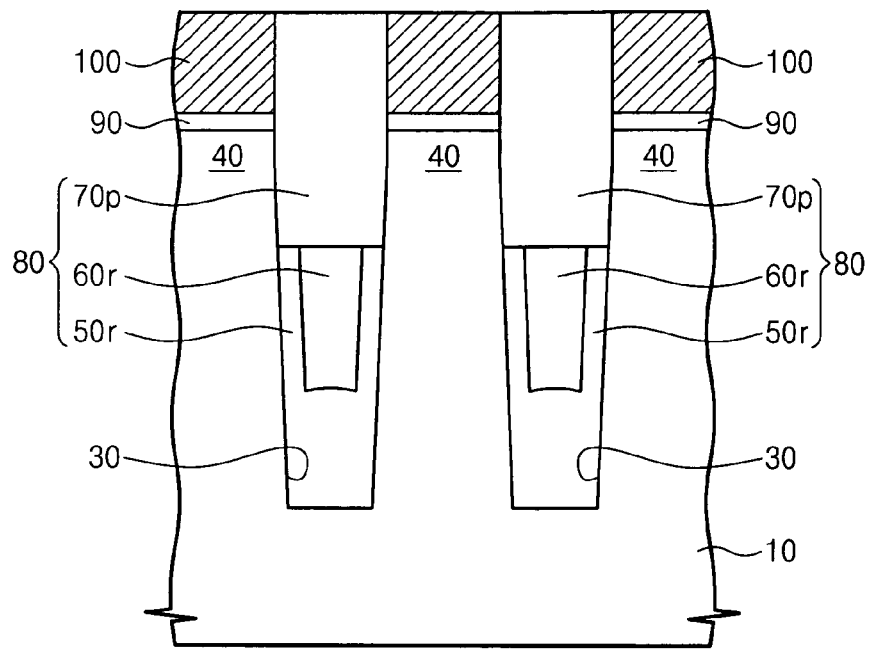

As illustrated in FIG. 5G, a gate dielectric layer 90 may be formed by inducing thermal oxidation of the exposed surface of the active region 40. The gate dielectric layer and the exposed portions of the second oxide pattern 70p may then be covered with a conductive layer. As will be appreciated by those skilled in the art, the conductive layer may comprise a composite structure of two or more conductive materials selected to provide an acceptable combination of properties including, for example, conductivity, tolerance to subsequent processing, adhesion and/or resistance to diffusion. For example, the conductive layer may materials selected from a group consisting of polysilicon, metal, metal nitrides, metal oxides, metal silicides and combinations thereof. Upper portions of the conductive layer may then be removed by, for example, a CMP process, until upper surfaces of the second oxide pattern 70p are exposed, thereby forming a self-aligned gate dielectric pattern 90 and a self-aligned floating gate pattern 100 above the surface of the active region 40.

Figure 5H:
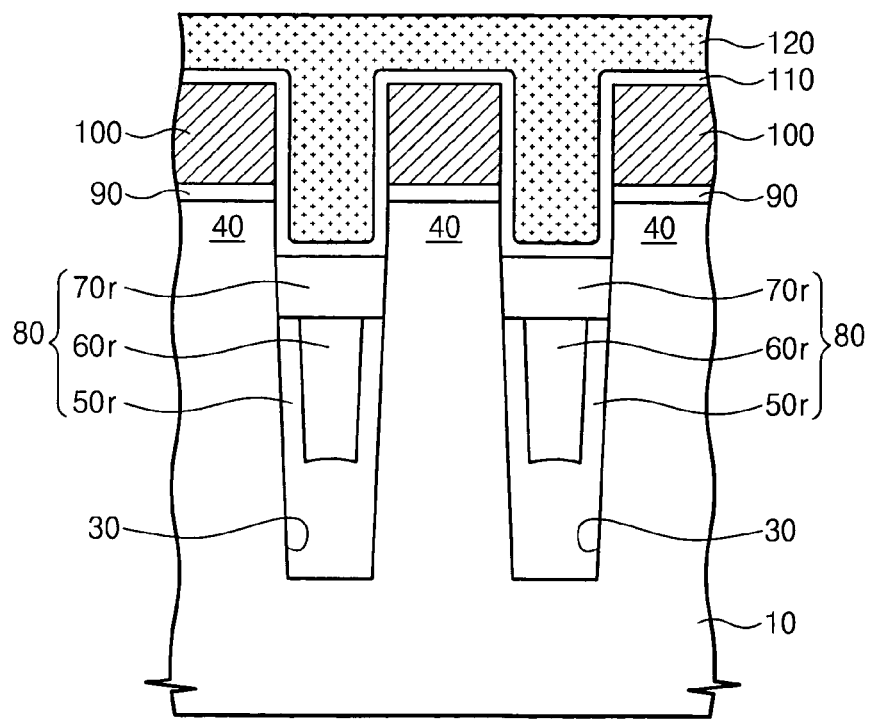

As illustrated in FIG. 5H, an upper portion of the second oxide pattern 70p may be removed to form a recessed second oxide pattern 70r having a surface lying below a plane defined by the upper surfaces of the adjacent active region 40. As used The upper portion of the second oxide pattern may be removed using an second E/B process to achieve a recess of about 100-300 Å, for example, about 200 Å, relative to a plane defined by the upper surfaces of the adjacent active regions 40. Please note that as used herein, relative spatial terms including, for example, "upper," "lower," "above," and/or "below," are used to describe the relative positions of layers and structures with respect to the substrate 10 as illustrated in the Figures.

As illustrated in FIG. 5H, a blocking layer 110, for example an oxide or a composite ONO (oxide-nitride-oxide) structure, and a second conductive layer 120, that may be utilized as a control gate electrode, are then sequentially formed on the exposed surfaces of the previously formed structures. The second conductive layer 120 may include, for example, one or more materials selected from a group consisting of polysilicon, metal, metal silicides, metal nitrides and combinations thereof. As reflected in FIG. 5H, the recessed SOG oxide pattern 60r is isolated by the combination of the first and second oxide patterns 50r, 70r from the gate dielectric layer 90 and the blocking dielectric layer 110. This isolation of the SOG material can reduce the carbon effect associated with SOG materials, and may thereby improve the uniformity of the subsequent films and/or the reliability of the resulting semiconductor devices.

The structure illustrated in FIG. 5H may also provide other advantages including, for example, improved coupling ratios associated with the increased overlap or contacting area between the floating gate electrode 100 and the control gate 120 enabled by the recessed trench isolation structure 80. Another advantage that may be provided by the structure illustrated in FIG. 5H is reduced interference between the floating gates enabled by the extension of the control gate into the spaces separating adjacent floating gates.

Figure 6A:
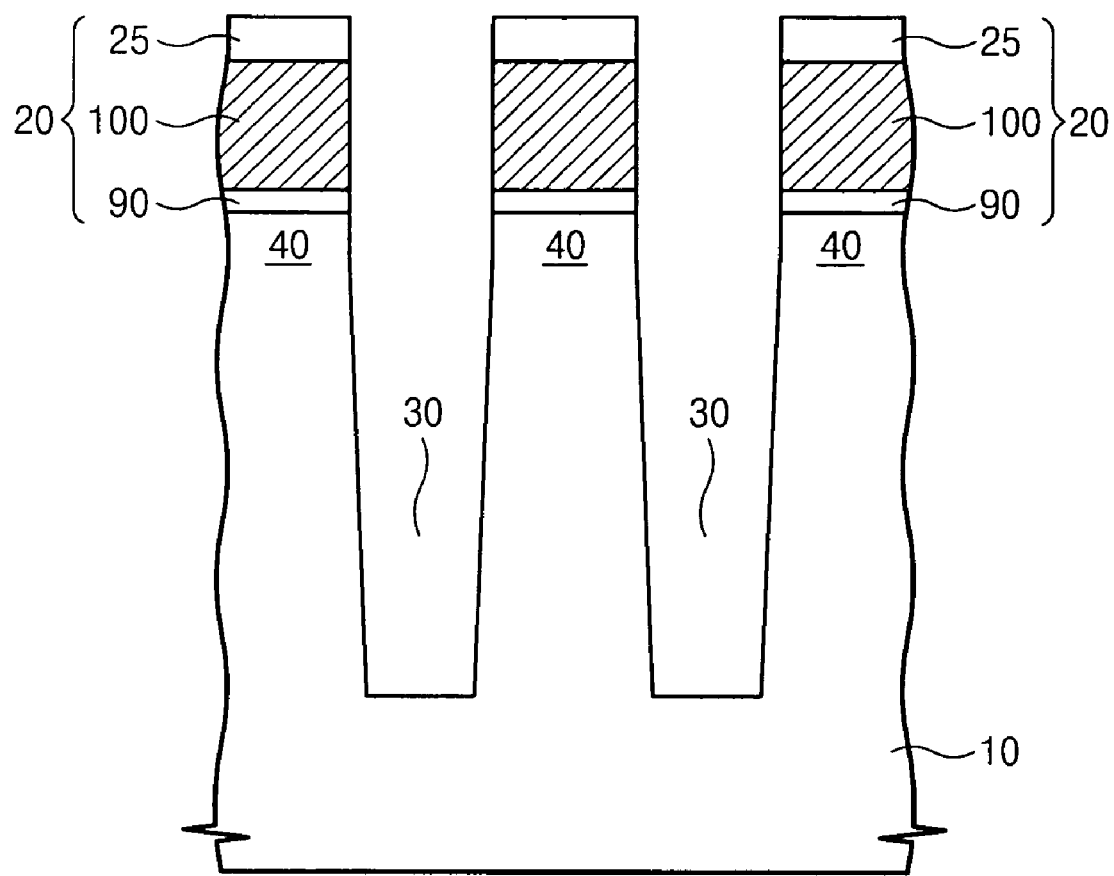
FIGS. 6A-6E are cross-sectional representations of a third example embodiment of a method for forming isolation structures and the resulting trench isolation structures.

Another example embodiment of a method for forming trench isolation structures and the resulting trench isolation structure configuration is illustrated in the cross-sections provided in FIGS. 6A-6E. As illustrated in FIG. 6A, a mask pattern 20 may is formed on the substrate 10. The mask pattern 20 incorporates a gate dielectric pattern 90, a first floating gate conductive pattern 100 and a capping pattern 25 formed by patterning and etching a composite structure of dielectric and conductive material layers (not shown). Example embodiments of the mask pattern include a conductive pattern 100 of polysilicon and a capping pattern 25 of a dielectric material selected from a group including, for example, silicon oxide, silicon nitride, silicon oxynitride and combinations thereof. The capping pattern 25 may be utilized as an etch mask and/or a CMP stopping layer and thereby protect the floating gate conductive pattern 100 from damage during subsequent processing. Trenches 30 are formed by etching the portions of the substrate 10 exposed by the mask pattern 20 to define a plurality of active regions 40.

Figure 6B:
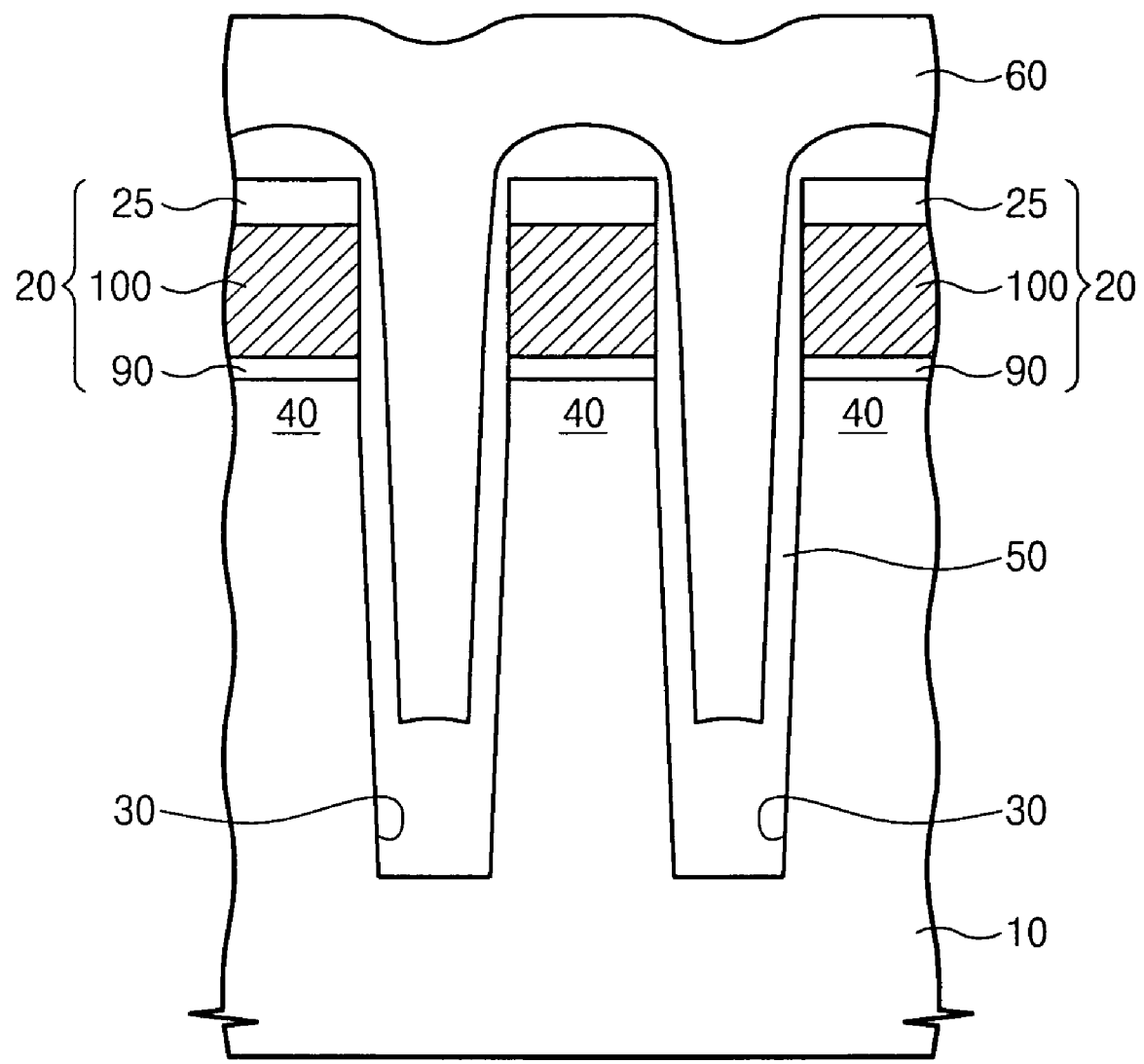
Figure 6C:
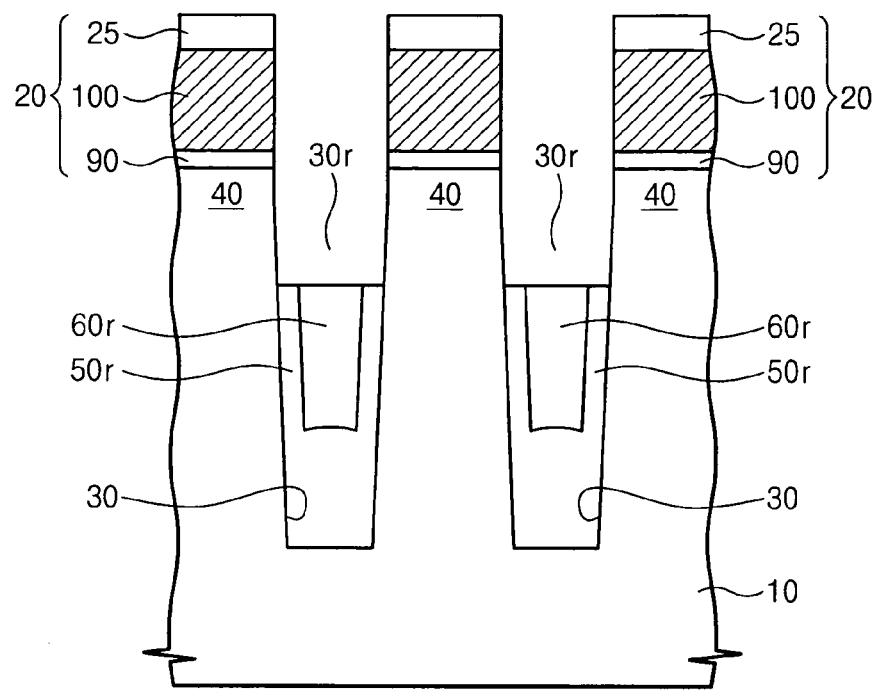

As illustrated in FIG. 6B, a first oxide layer 50 is then formed along the sidewall and the bottom surfaces of the trench 30 and the exposed surfaces of the mask pattern 20 using, for example, a HDP CVD method. A SOG oxide layer 60 is then formed on the first oxide layer 50 to a thickness sufficient to fill remainder of the trench 30 using, for example, a combination of spin-coating and heat treatment processes. As illustrated in FIG. 6C, upper portions of the SOG oxide layer 60 and the first oxide layer 50 are then removed using an initial CMP process using the capping pattern 25 as a stopping layer followed by an E/B process as generally detailed above in connection with FIGS. 5C and 5D to obtain a recessed SOG oxide pattern 60r and a recessed first oxide pattern 50r. As reflected in FIG. 6C, the upper surfaces of the recessed SOG oxide pattern 60r and the recessed first oxide pattern 50r form a generally flat surface that is recessed relative to a plane defined by the upper surfaces of the active regions 40 and define a lower surface of a recessed trench pattern 30r.

Figure 6D:
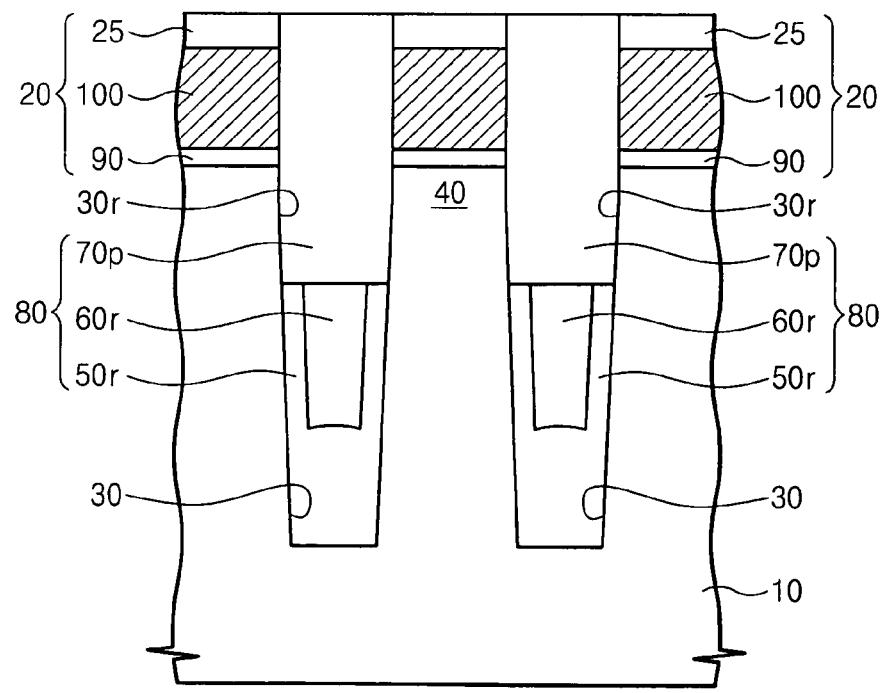

As illustrated in FIG. 6D, a second oxide layer (not shown) may be deposited on the substrate to a thickness sufficient to fill the recessed trench pattern 30r. An upper portion of the second oxide layer may then be removed using a CMP process with the capping pattern 25 as a stop layer to form a second oxide pattern 70p to obtain a composite trench isolation structure 80 including the recessed SOG pattern 60r that is generally encapsulated by the recessed first oxide pattern 50r below and the second oxide pattern 70p above.

Figure 6E:
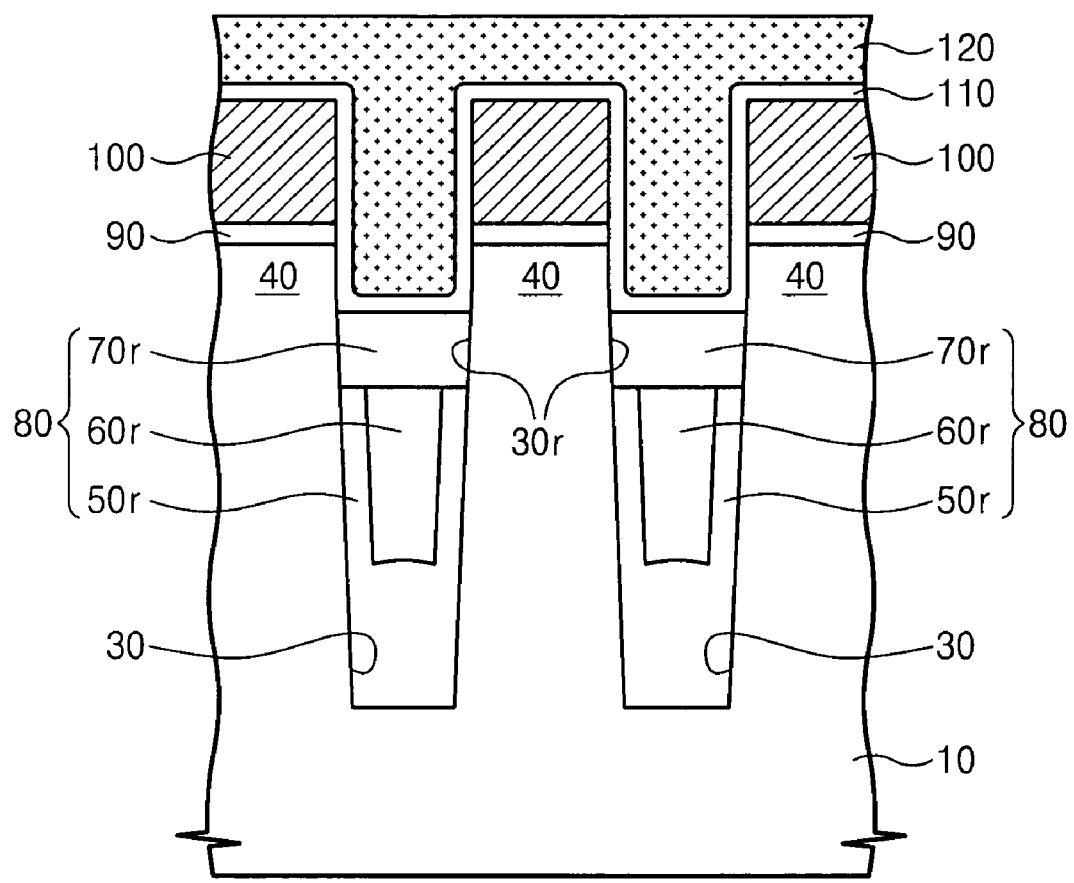

As illustrated in FIG. 6E, an upper portion of the second oxide pattern 70p may then be removed to obtain a recessed second oxide pattern 70r having an upper surface that is recessed relative to a plane defined by the upper surfaces of the adjacent active regions 40. The capping pattern 25 may then be removed to expose the floating gate conductive pattern 100. A blocking dielectric layer 110 and a control gate electrode layer 120 may then be sequentially formed on the exposed surfaces of the recessed second oxide pattern 70r, the sidewall surfaces of the active regions 40, the gate dielectric pattern 90 and the floating gate conductive pattern 100. Depending on the applicable design rules and the limitations and capabilities of the deposition, etch and planarization equipment utilized, in some instances all or substantially all of the second oxide pattern 70p may be removed during the subsequent etchback, but failing to encapsulate the recessed SOG pattern 60r may compromise the functional and reliability performance of the resulting semiconductor devices while still providing certain of the benefits associated with the reconfiguration of the control gate electrode 120 as noted above. Accordingly, those skilled in the art may make an independent determination regarding the necessity of the second oxide pattern 70p and, more specifically, the recessed second oxide pattern 70r in light of the desired performance criteria for the completed device.

Another example embodiment of the method generally illustrated in FIGS. 6A-6E may be utilized for forming insulating structures between portions of conductive patterns including, for example, gate electrode patterns, word line patterns and bit line patterns. As with the example embodiments discussed above and illustrated in, for example, FIG. 5H, the trench isolation structure illustrated in FIG. 6E may provide improvements in the coupling ratios as a result of the increased contacting area provided between the floating gate electrode and the control gate electrode resulting from the extension of the control gate electrode below a plane defined by the upper surfaces of the adjacent active regions 40. Similarly, the trench isolation structure illustrated in FIG. 6E may suppress interference between adjacent floating gates as a result of the extension of the control gate into the space above the composite trench isolation structure 80 and between the electrodes defined by the floating gate conductive pattern 100. Example embodiments of methods for fabricating semiconductor devices as illustrated in FIGS. 5A-5H and 6A-6E may also provide improved uniformity between the trench isolation structures provided in the cell and the peripheral regions respectively by reducing the likelihood of overetching in the peripheral regions by using the combination of CMP and E/B methods for forming the recessed patterns and/or utilizing a combination of first oxide materials and SOG materials that exhibit substantially similar removal rates under the chemistry and conditions utilized in the E/B method.

As will be appreciated by those skilled in the art from the description above and the corresponding Figures, example embodiments include methods of fabricating trench isolation structures that may provide reduced leakage, improved process yield and/or improved reliability by reducing the occurrence of voids in trench isolation structures, particularly those having higher aspect ratios and/or reducing the likelihood of overetch damage in the peripheral regions during E/B processes.

As will be appreciated by those skilled in the art, other combinations of insulating, semiconducting and conducting materials may be utilized in practicing methods in accord with the example embodiments detailed above. Such alternative combinations of materials, however, should be selected to provide appropriate combinations of properties whereby the trench isolation structures illustrated above may be reproduced. Appropriate combinations of the properties include, for example, a combination of a first insulating material or materials capable of reducing leakage, e.g., HDP oxide, a second insulating material or material(s) capable of forming generally uniform plugs of material filling the remaining portions of recesses, particularly higher aspect ratio recesses, e.g., SOG, while exhibiting substantially similar etch rates under the same E/B process chemistry and conditions, e.g., a combination of an initial HDP oxide over which a densified SOG oxide is formed.

Accordingly, although certain example embodiments have been disclosed for illustrative purposes, those skilled in the art will appreciate that various conventional modifications, additions and substitutions to the particular materials and techniques are possible, without departing from the scope and spirit of the disclosure.

We claim:

1. A method of fabricating a semiconductor device comprising, in order:
    forming a hard mask pattern exposing a cell region portion and a peripheral region portion of a semiconductor substrate;
    removing the exposed portions of the semiconductor substrate to form a cell region trench structure and a peripheral region trench structure;
    depositing a first insulating layer to a thickness $T_{f1}$ whereby the trench structures are only partially filled;
    depositing a spin-on-glass (SOG) layer to a thickness $T_S$ sufficient to fill the cell region trench structure;
    treating the SOG layer to form a silicon oxide layer;
    removing upper portions of the silicon oxide layer and the first insulating layer to form a planarized surface having exposed surfaces of a silicon oxide layer pattern, a first insulating layer pattern and the hard mask pattern;
    removing a thickness $T_r$ of material from both the cell region trench structure and the peripheral region trench structure to form first recesses that have a bottom surface below a reference plane defined by the primary surface of the semiconductor substrate,
        wherein the bottom surface includes exposed surfaces of a modified silicon oxide pattern and a modified first insulating layer pattern,
    depositing a second insulating layer to a depth $T_{f2}$ sufficient to fill the recessed regions; and
    removing an upper portion of the second insulating layer to form a planarized surface including a second insulating layer pattern and the hard mask pattern.

2. The method of fabricating a semiconductor device according to claim 1, wherein:
    the cell region trench structure has a depth $D_c$ and the peripheral region trench structure has a depth $D_p$, both depths being measured from a primary. surface of the semiconductor substrate adjacent the trench structure, and further wherein the expression $D_p \geq D_c$ is satisfied.

3. The method of fabricating a semiconductor device according to claim 2, wherein:
    the peripheral region trench structure $D_p$ is no more that 250% of the cell region trench structure $D_c$.

4. The method of fabricating a semiconductor device according to claim 1, wherein:
    the thickness $T_s$ of the spin-on-glass (SOG) layer is sufficient to fill the peripheral region trench structure.

5. The method of fabricating a semiconductor device according to claim 1, wherein:
    the thickness $T_s$ of the spin-on-glass (SOG) layer is not sufficient to fill the peripheral region trench structure.

6. The method of fabricating a semiconductor device according to claim 5, further comprising:
    depositing a sacrificial insulating layer to a thickness sufficient to fill the peripheral region trench structure;
    removing upper portions of the sacrificial insulating layer, the silicon oxide layer and the first insulating layer to form a planarized surface having exposed surfaces of a sacrificial insulating layer pattern, a silicon oxide layer pattern, a first insulating layer pattern and the hard mask pattern;
    removing a thickness $T_r$ of material from both the cell region trench structure and the peripheral region trench structure to form first recesses that have a bottom surface below a reference plane defined by the primary surface of the semiconductor substrate,
        wherein the bottom surface includes exposed surfaces of a modified silicon oxide pattern and a modified first insulating layer pattern,
    depositing a second insulating layer to a depth $T_{f2}$ sufficient to fill the recessed regions; and
    removing an upper portion of the second insulating layer to form a planarized surface including a second insulating layer pattern and the hard mask pattern.

7. The method of fabricating a semiconductor device according to claim 1, wherein:
    the recessed region in the cell region has an aspect ratio $A_c$ and the recessed region in the peripheral region has an aspect ratio $A_p$ that satisfy the expression $A_c \geq A_p$.

8. The method of fabricating a semiconductor device according to claim 1, wherein:
    the recessed region aspect ratio $A_c$ is no greater than 5.

9. The method of fabricating a semiconductor device according to claim 1, wherein treating the SOG layer further comprises:
    removing a majority of a solvent from a SOG composition containing a major portion of polysilazane; and
    converting the polysilazane to silicon oxide.

10. The method of fabricating a semiconductor device according to claim 1, further comprising:
    removing the hard mask pattern to expose active regions on the primary surface of the semiconductor substrate;
    forming a dielectric pattern on the exposed active regions;
    forming a semiconductor material pattern on the dielectric pattern;
    removing an upper portion of the second insulating layer pattern to form openings having a bottom surface below the reference plane;
    forming a second dielectric material layer on exposed surfaces of the semiconductor material pattern, the dielectric pattern, the semiconductor substrate and the bottom surface of the openings;
    depositing a conductive material layer on the second dielectric material layer; and
    forming a conductive material layer pattern having extended regions that extend below a reference plane defined by top surfaces of adjacent portions of the semiconductor material pattern.

11. The method of fabricating a semiconductor device according to claim 10, wherein:
    the extended regions that reach a reference plane defined by the primary surface of the semiconductor substrate.

12. The method of fabricating a semiconductor device according to claim 10, wherein:

the extended regions that extend below a reference plane defined by the primary surface of the semiconductor substrate.

13. The method of fabricating a semiconductor device according to claim 10, wherein:
the bottom surface of the openings is from 300 to 500 Å below the reference plane.

14. The method of fabricating a semiconductor device according to claim 1, wherein:
the first insulating layer has a first average thickness $T_{I1a}$ on surfaces parallel to the reference plane and a second average thickness $T_{I1b}$ on sidewalls of the trench structure that satisfy the expression $T_{I a}>T_{I1b}$.

15. The method of fabricating a semiconductor device according to claim 10, further comprising:
forming an etch mask pattern in the peripheral region before removing the upper portion of the second insulating material pattern to protect the second insulating material pattern in the peripheral regions.

16. The method of fabricating a semiconductor device according to claim 10, wherein:
the second dielectric material layer has a composite structure including silicon oxide/silicon nitride/silicon oxide (ONO).

17. The method of fabricating a semiconductor device according to claim 10, wherein:
the conductive material layer includes a conductor selected from a group consisting of polysilicon, metals, metal nitrides, metal silicides and combinations thereof.

18. The method of fabricating a semiconductor device according to claim 1, wherein:
the first insulating layer is selected from a group consisting of HDP, TEOS, USG and combinations thereof.

19. The method of fabricating a semiconductor device according to claim 1, wherein:
the second insulating layer is selected from a group consisting of HDP, TEOS, USG and combinations thereof.

20. The method of fabricating a semiconductor device according to claim 1, further comprising:
removing an upper portion of the second insulating layer pattern to form openings in the cell region trench structure having a bottom surface;
forming a dielectric material layer on exposed surfaces of the hard mask pattern, the semiconductor substrate and the bottom surface of the openings;
depositing a conductive material layer on the dielectric material layer; and
forming a conductive material layer pattern having extended regions that extend between adjacent portions of the semiconductor material pattern.

21. The method of fabricating a semiconductor device according to claim 20, wherein:
the extended regions that reach a reference plane defined by the primary surface of the semiconductor substrate.

22. The method of fabricating a semiconductor device according to claim 20, wherein:
the extended regions that extend below a reference plane defined by the primary surface of the semiconductor substrate.

23. The method of fabricating a semiconductor device according to claim 1, further comprising:
treating surfaces of the semiconductor substrate exposed within the trench structure to reduce etch damage.

24. The method of fabricating a semiconductor device according to claim 23, wherein treating surfaces of the semiconductor substrate further comprises:
forming a thermal oxide on the surfaces to a thickness sufficient to consume a damaged surface portion of the semiconductor substrate.

25. The method of fabricating a semiconductor device according to claim 1, wherein the hard mask pattern further comprises:
a pad layer formed directly on a primary surface of the semiconductor substrate; and
a primary mask layer formed directly on a surface of the pad layer.

26. The method of fabricating a semiconductor device according to claim 25, wherein:
the pad layer is a silicon oxide layer having a thickness $T_p$; and
the primary mask layer is a silicon nitride layer having a thickness $T_m$.

27. The method of fabricating a semiconductor device according to claim 26, wherein:
the expression $T_m>T_p$ is satisfied.

28. The method of fabricating a semiconductor device according to claim 1, wherein forming the hard mask pattern further comprises:
forming a dielectric layer on a primary surface of the semiconductor substrate;
forming semiconductor material layer on the dielectric layer;
forming a capping layer on the semiconductor material layer; and
patterning and etching the capping layer, semiconductor material layer and the dielectric layer.

29. The method of fabricating a semiconductor device according to claim 1, wherein treating the SOG layer further comprises:
heating the SOG layer to a first temperature $T_1$ to remove the solvent and thereby form an intermediate polysilazane layer; and
heating the polysilazane layer under an oxidizing ambient to a second temperature $T_2$ sufficient to convert the polysilazane layer to the silicon oxide layer, wherein the expression $T_2>T_1$ is satisfied.

30. The method of fabricating a semiconductor device according to claim 29, wherein treating the SOG layer further comprises:
heating the silicon oxide layer to a third temperature $T_3$ sufficient to densify the silicon oxide layer, wherein the expression $T_3>T_2$ is satisfied, and maintaining the third temperature for a period sufficient to obtain a degree of densification.

31. The method of fabricating a semiconductor device according to claim 30, wherein:
the degree of densification is sufficient to produce a densified silicon oxide layer that exhibits an etch removal rate within 5% of an etch removal rate of the first insulating layer under an identical etch process.

32. The method of fabricating a semiconductor device according to claim 10, wherein:
at least 100 Å of the second insulating material pattern remains below the bottom surface of the openings.

* * * * *